(12) United States Patent
Peters

(10) Patent No.: US 10,475,787 B2
(45) Date of Patent: Nov. 12, 2019

(54) ASYMMETRIC TRANSIENT VOLTAGE SUPPRESSOR DEVICE AND METHODS FOR FORMATION

(71) Applicant: Littelfuse, Inc., Chicago, IL (US)

(72) Inventor: James Allan Peters, Wiltshire (GB)

(73) Assignee: LITTELFUSE, INC., Chicago, IL (US)

(*) Notice: Subject to any disclaimer, the term of this patent is extended or adjusted under 35 U.S.C. 154(b) by 0 days.

(21) Appl. No.: 15/816,115

(22) Filed: Nov. 17, 2017

(65) Prior Publication Data
US 2019/0157265 A1    May 23, 2019

(51) Int. Cl.
| | |
|---|---|
| H01L 27/08 | (2006.01) |
| H01L 23/495 | (2006.01) |
| H01L 29/06 | (2006.01) |
| H01L 29/861 | (2006.01) |
| H01L 29/66 | (2006.01) |

(52) U.S. Cl.
CPC .... *H01L 27/0814* (2013.01); *H01L 23/49551* (2013.01); *H01L 23/49562* (2013.01); *H01L 29/0661* (2013.01); *H01L 29/861* (2013.01); *H01L 23/49555* (2013.01); *H01L 29/0649* (2013.01); *H01L 29/66113* (2013.01); *H01L 29/66136* (2013.01); *H01L 29/8613* (2013.01); *H01L 2224/16245* (2013.01); *H01L 2924/181* (2013.01)

(58) Field of Classification Search
None
See application file for complete search history.

(56) References Cited

U.S. PATENT DOCUMENTS

2013/0240903 A1* 9/2013 Kashyap ............... H01L 21/50
257/77

* cited by examiner

*Primary Examiner* — Fazli Erdem
*Assistant Examiner* — Scott R Wilson

(57) ABSTRACT

A transient voltage suppression (TVS) device, may include: a substrate base formed in a substrate, the substrate base comprising a semiconductor of a first conductivity type; and an epitaxial layer, disposed on the substrate base, on a first side of the substrate, and comprising a semiconductor of a second conductivity type. The epitaxial layer may include: a first portion, the first portion having a first layer thickness; and a second portion, the second portion having a second layer thickness, less than the first layer thickness, wherein the first portion and the second portion are disposed on a first side of the substrate, and wherein the first portion is electrically isolated from the second portion.

14 Claims, 2 Drawing Sheets

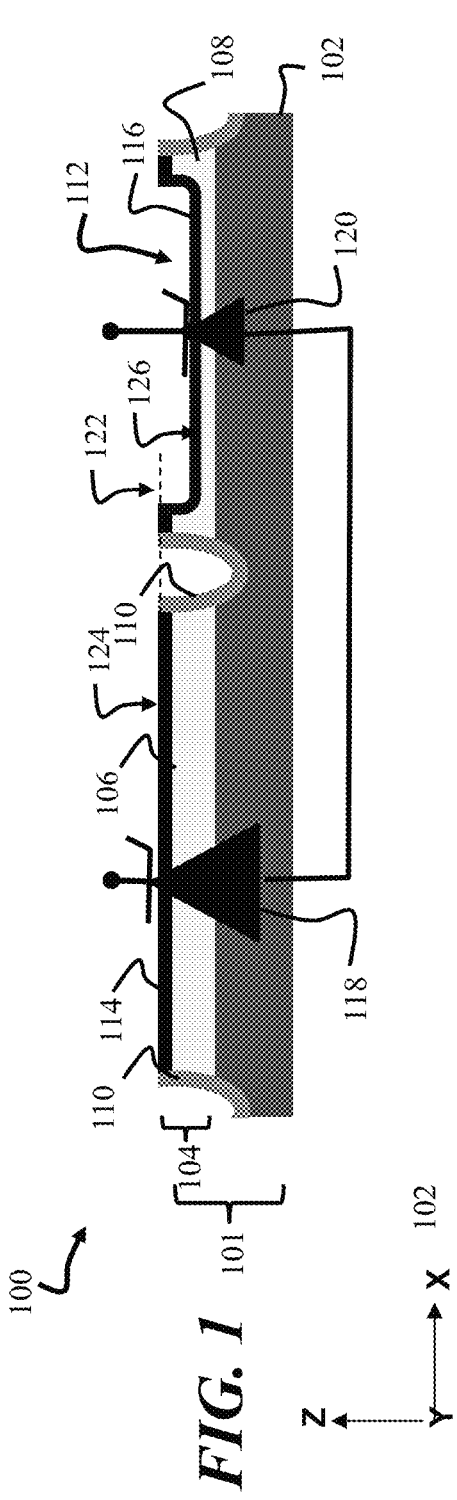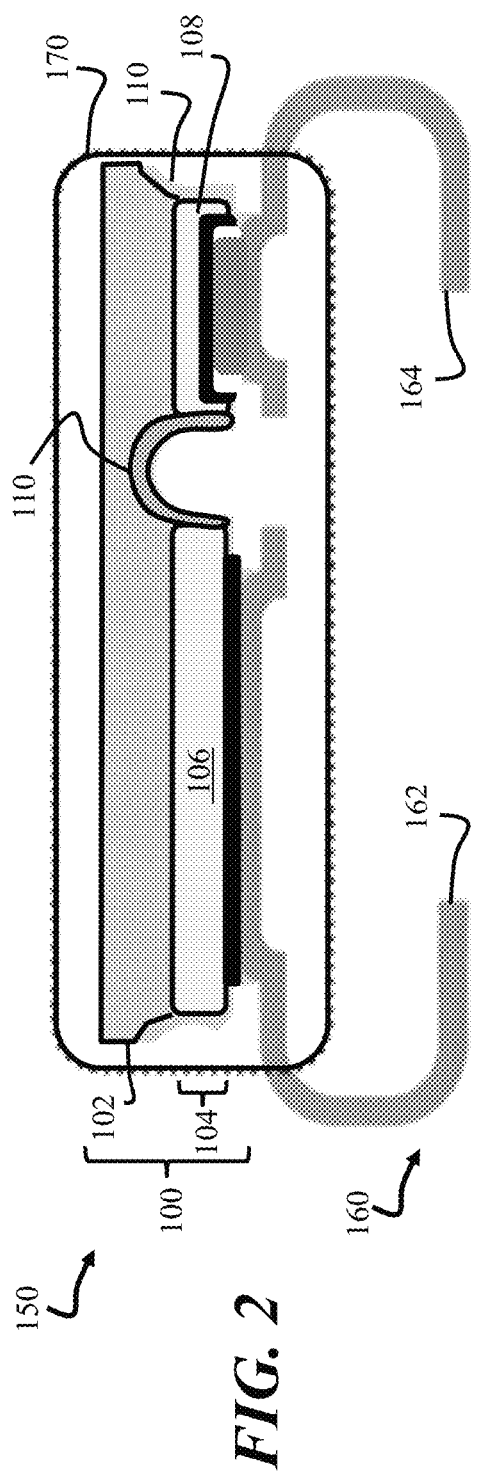

ASYMMETRIC TRANSIENT VOLTAGE SUPPRESSOR DEVICE AND METHODS FOR FORMATION

BACKGROUND

Field

Embodiments relate to the field of circuit protection devices, including fuse devices.

Discussion of Related Art

Semiconductor devices such as transient voltage suppressor (TVS) devices may be fabricated as unidirectional devices or bidirectional devices. In the case of bidirectional devices, a first device may be fabricated on a first side of a semiconductor die (chip), while a second device may be fabricated on a second side of the semiconductor die. Bidirectional devices may include symmetric devices where the first device and second device are the same, as well as asymmetric devices, where the first device and second device differ in properties.

While such bidirectional devices provide some flexibility in designing electrical properties of the different devices on different sides of a semiconductor die, the packaging of such devices may be relatively complex.

With respect to these and other considerations, the present disclosure is provided.

SUMMARY

Exemplary embodiments are directed to improved TVS devices and techniques for forming TVS devices.

In one embodiment, a transient voltage suppression (TVS) device may include a substrate base formed in a substrate, the substrate base comprising a semiconductor of a first conductivity type; and an epitaxial layer, disposed on the substrate base, on a first side of the substrate, and comprising a semiconductor of a second conductivity type. The epitaxial layer may include: a first portion, the first portion having a first layer thickness; and a second portion, the second portion having a second layer thickness, less than the first layer thickness, wherein the first portion and the second portion are disposed on a first side of the substrate, and wherein the first portion is electrically isolated from the second portion.

In another embodiment, a transient voltage suppression (TVS) device assembly may include a TVS device, where the TVS device includes a substrate base formed in a substrate, the substrate base comprising a semiconductor of a first conductivity type. The TVS device may include an epitaxial layer, disposed on the substrate base, on a first side of the epitaxial layer comprising a semiconductor of a second conductivity type. The epitaxial layer may further include a first portion, the first portion having a first layer thickness; and a second portion, the second portion having a second layer thickness, less than the first layer thickness, wherein the second portion comprises a trench shape, wherein a plane defined by a first upper surface of the first portion is above a second upper surface of the second portion. The TVS device assembly may also include a leadframe, the leadframe being coupled to the TVS device, the leadframe comprising: a first part, the first part being connected to the first portion of the TVS device; and a second part, the second part being coupled to the second portion of the TVS device.

In another embodiment, a method may include providing a substrate having a base layer of a first conductivity type; forming an epitaxial layer of a second conductivity type on the base layer, wherein the epitaxial layer is disposed on a first side of the substrate; forming a first epitaxial portion and a second epitaxial portion within the epitaxial layer, wherein the first epitaxial portion is electrically isolated from the second epitaxial portion; forming a recess within the second epitaxial portion, wherein the first diode and the second diode are formed within the epitaxial layer on the first side of the substrate.

BRIEF DESCRIPTION OF THE DRAWINGS

FIG. 1 illustrates a TVS device according to embodiments of the disclosure;

FIG. 2 illustrates a TVS device assembly according to other embodiments of the disclosure;

DESCRIPTION OF EMBODIMENTS

Figure 3:
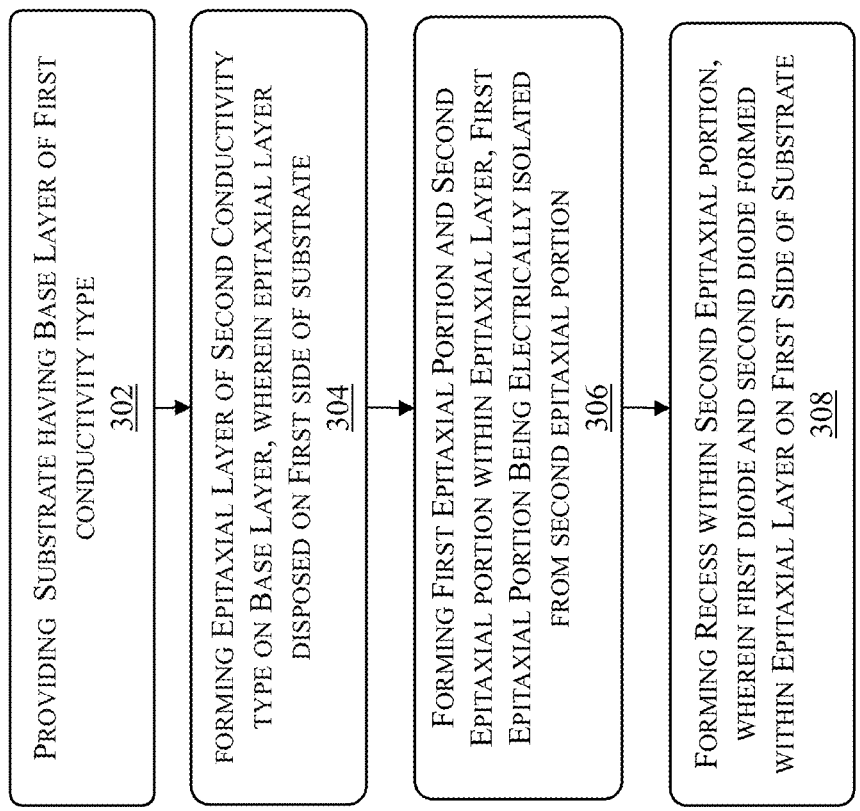
FIG. 3 depicts an exemplary process flow according to embodiments of the disclosure.

The present embodiments will now be described more fully hereinafter with reference to the accompanying drawings, in which exemplary embodiments are shown. The embodiments are not to be construed as limited to the embodiments set forth herein. Rather, these embodiments are provided so that this disclosure will be thorough and complete, and will fully convey their scope to those skilled in the art. In the drawings, like numbers refer to like elements throughout.

In the following description and/or claims, the terms "on," "overlying," "disposed on" and "over" may be used in the following description and claims. "On," "overlying," "disposed on" and "over" may be used to indicate that two or more elements are in direct physical contact with one another. Also, the term "on,", "overlying," "disposed on," and "over", may mean that two or more elements are not in direct contact with one another. For example, "over" may mean that one element is above another element while not contacting one another and may have another element or elements in between the two elements.

In various embodiments, novel device structures and techniques are provided for forming a bidirectional TVS device.

FIG. 1 illustrates a TVS device 100 according to embodiments of the disclosure. The TVS device 100 may include a substrate base 102 formed in a substrate 101. The substrate base 102 may be formed of a semiconductor of a first conductivity type, such as a P-type semiconductor. The TVS device 100 may further include an epitaxial layer 104, disposed on the substrate base 102, on a first side of the substrate 101 (top side in FIG. 1) as shown. The epitaxial layer 104 may be formed of a semiconductor of a second conductivity type. For example, when the substrate base 102 is P-type silicon, the epitaxial layer may be N-type silicon. For example, when the substrate base 102 is N-type silicon, the epitaxial layer may be P-type silicon. As such, a P/N junction may be formed at the interface between the substrate base 102 and epitaxial layer 104. The epitaxial layer 104 may further comprise a first portion 106 and a second portion 108. The first portion 106 may have a first layer thickness, while the second portion 108 may have a second layer thickness, less than the first layer thickness. As shown, the first portion 106 and the second portion 108 are disposed on the first side of the substrate 101. The first portion 106 is electrically isolated from the second portion 108, by virtue of an isolation structure 110. As shown, the isolation structure 110 extends from the surface of the first side of the substrate 101 into the substrate base 102. The isolation structure 110 may be formed in a known manner, such as using a trench insulator.

As such, the first portion 106 forms a first diode 118, in conjunction with the substrate base 102. As such, the second portion 108 forms a second diode 120, in conjunction with the substrate base 102. According to various embodiments of the disclosure, the first diode differs from the second diode in breakdown voltage, power capacity, or breakdown voltage and power capacity. For example, by virtue of the second portion 108 of the epitaxial layer 104 having a relatively lesser thickness as compared to the first portion 106, the breakdown voltage of the second portion 108 may be lower as compared to the breakdown voltage of the first portion 106. For example, the first layer thickness of the first portion 106 may be between 20 µm and 80 µm in some embodiments, while for a given first layer thickness of the first portion 106, the second layer thickness of the second portion 108 may be less than the given first layer thickness.

As further shown in FIG. 1, the first diode 118 and the second diode 120, formed within the substrate 101, are arranged in electrical series in an anode-to-anode configuration. The respective cathodes of the first diode 118 and the second diode 120 may be electrically contacted through contact 114 and contact 116, respectively, formed on the first side of the substrate 101. As such, the TVS device 100 may form an asymmetric single sided bi-directional device.

The degree of voltage asymmetry between the first diode 118 and the second diode 120 may be arranged by adjusting the relative thickness of the first layer thickness of first portion 106 as compared to the second layer thickness of the second portion 108. For example, in various embodiments, the epitaxial layer 104 is formed as a blanket layer on the substrate base 102, so the dopant level is uniform across the epitaxial layer 104. While the first portion 106 may remain unaltered, after the initial formation of the epitaxial layer 104 with a uniform thickness, the second portion 108 may be etched to reduce the layer thickness of the second portion 108. For example, the second portion 108 may be selectively etched by masking the first portion 106 while subjecting the second portion 108 to a known etchant, forming a recess or a trench shape, as shown by the trench 112. In the example of FIG. 1, a plane 122 defined by a first upper surface 124 of the first portion 106 is above a second upper surface 126 of the second portion 108.

The second portion 108 may be etched to form a uniform, second layer thickness over most of the area (within the plane of the substrate 101) of the second portion 108, such as 80% of the area, 90% of the area, 99% of the area, and so forth. In this manner, the second portion 108 may be etched to a target average layer thickness to adjust the breakdown voltage of the second diode 120 to be different from the breakdown voltage of the first diode 118. Because the first portion 106 and the second portion 108 may have the same active dopant concentration, the different breakdown voltage to be imparted to the second diode 120 may be readily adjusted to a target value by etching a target amount of the second portion to reach a target thickness. For example, if the first diode 118 is formed with a first layer thickness of 60 µm and a breakdown voltage of 600 V, the second diode 120 may be formed by etching to yield a second layer thickness of the second portion 108 of 30 µm, in order to yield a breakdown voltage of much less than 600 V.

The above example of voltage asymmetry between first diode 118 and second diode 120 is merely exemplary while the embodiments are not limited in this context. In various additional embodiments, the first diode 118 may comprise a breakdown voltage of 300 V or greater, and while the second diode 120 comprises a breakdown voltage of 100 V or less. Again, the embodiments are not limited in this context.

In other embodiments, where the first diode 118 and second diode 120 exhibit asymmetry in power capacity, the first diode 118 may comprise a power capacity of 700 W or greater, and the second diode may comprise a power capacity of 500 W or less. The power capacity of the first diode 118 and second diode 120 may be set to be different from one another. The power capacity may be adjusted by adjusting the areas of the first portion 106 and the second portion 108 within the plane (X-Y plane of the Cartesian coordinate system shown) of the substrate 101. The areas may be adjusted by forming masks of different sizes to define the first portion 106 and second portion 108, according to known techniques in the art.

An advantage of the design of FIG. 1 for an asymmetric device is that a leadframe may be attached to just one side of the substrate 101, in order to contact the different diodes. FIG. 2 illustrates a TVS device assembly 150. The TVS device assembly 150 may include the TVS device 100 and leadframe 160, where the leadframe 160 contacts the first surface of the TVS device 100, meaning the upper surface of FIG. 1. In this example, the leadframe 160 may include a first part 162, where the first part 162 is connected to the first portion 106 of the TVS device 100, and may include a second part 164, coupled to the second portion 108 of the TVS device 100. In the example of FIG. 2 the TVS assembly includes a housing 170, which housing may be a molded package. The leadframe 160 may be conveniently attached to the TVS device 100 by soldering or other bonding method.

FIG. 3 depicts an exemplary process flow 300 according to embodiments of the disclosure. At block 302, a substrate is provided, where the substrate includes a base layer of a first conductivity type. The substrate may be, for example, a p-type silicon substrate where the base layer represents the substrate itself. At block 304, an epitaxial layer of a second conductivity type is formed on the base layer, wherein the epitaxial layer is disposed on a first side of the substrate. As such, the epitaxial layer may be n-type silicon when the substrate base in p-type silicon. The epitaxial layer may be formed according to known deposition methods. The dopant concentration in the epitaxial layer and layer thickness of the epitaxial layer may be designed according to electrical properties for a diode to be formed in the substrate. In various embodiments, the layer thickness of the epitaxial layer may range from 20 µm to 80 µm. The embodiments are not limited in this context.

At block 306 a first epitaxial portion and a second epitaxial portion are formed within the epitaxial layer, where the first epitaxial portion is electrically isolated from the second epitaxial portion. The first epitaxial portion and second epitaxial portion may be formed by generating isolation structure(s) according to known techniques, where the isolation structures extend through the entirety of the epitaxial layer.

At block 308, a recess is formed within the second epitaxial portion, wherein a first diode and a second diode are formed within the epitaxial layer on the first side of the substrate. Accordingly, the first diode is formed in the first portion of the epitaxial layer with a first layer thickness, while the second diode is formed in the second portion of the epitaxial layer with a second layer thickness. Thus, the first diode and the second diode may differ between one another in terms of breakdown voltage by virtue of the different thickness between the first portion and the second portion. In this manner, a single sided bidirectional asymmetric device may be conveniently formed.

While the present embodiments have been disclosed with reference to certain embodiments, numerous modifications, alterations and changes to the described embodiments are possible while not departing from the sphere and scope of the present disclosure, as defined in the appended claims. Accordingly, the present embodiments are not to be limited to the described embodiments, and may have the full scope defined by the language of the following claims, and equivalents thereof.

What is claimed is:

1. A transient voltage suppression (TVS) device, comprising:
    a substrate base formed in a substrate, the substrate base comprising a semiconductor of a first conductivity type; and
    an epitaxial layer, disposed directly on the substrate base, on a first side of the substrate, and comprising a semiconductor of a second conductivity type, the epitaxial layer further comprising:
        a first portion, extending from an interface between the substrate base and the first portion, the first portion having a first layer thickness; and
        a second portion, extending from the interface between the substrate base and the first portion, the second portion having a second layer thickness, less than the first layer thickness, wherein the first portion and the second portion are disposed on the first side of the substrate, and wherein the first portion is electrically isolated from the second portion.

2. The TVS device of claim 1, wherein the first portion forms a first diode, wherein the second portion forms a second diode, and wherein the first diode differs from the second diode in breakdown voltage, power capacity, or breakdown voltage and power capacity.

3. The TVS device of claim 2, wherein the first diode and the second diode are arranged in electrical series, anode-to-anode.

4. The TVS device of claim 2, wherein the first diode comprises a breakdown voltage of 300 V or greater, and wherein the second diode comprises a breakdown voltage of 100 V or less.

5. The TVS device of claim 2, wherein the first diode comprises a power capacity of 700 W or greater, and wherein the second diode comprises a power capacity of 500 W or less.

6. The TVS device of claim 1, wherein the first layer thickness is between 20 µm to 80 µm.

7. The TVS device of claim 1, wherein the second portion comprises a trench shape, wherein a plane defined by a first upper surface of the first portion is above a second upper surface of the second portion.

8. A transient voltage suppression (TVS) device assembly, comprising:
    a TVS device, the TVS device comprising:
        a substrate base formed in a substrate, the substrate base comprising a semiconductor of a first conductivity type;
        an epitaxial layer, disposed directly on the substrate base, on a first side of the epitaxial layer comprising a semiconductor of a second conductivity type, the epitaxial layer further comprising:
            a first portion, extending from an interface between the substrate base and the first portion, the first portion having a first layer thickness; and
            a second portion, extending from the interface between the substrate base and the first portion, the second portion having a second layer thickness, less than the first layer thickness, wherein the second portion comprises a trench shape, wherein a plane defined by a first upper surface of the first portion is above a second upper surface of the second portion; and
    a leadframe, the leadframe being coupled to the TVS device, the leadframe comprising:
        a first part, the first part being connected to the first portion of the TVS device; and
        a second part, the second part being coupled to the second portion of the TVS device.

9. The TVS device assembly of claim 8, wherein the leadframe is disposed on just one side of the TVS device.

10. The TVS device assembly of claim 8, wherein the first portion and the second portion are disposed on a first side of the substrate, and wherein the first portion is electrically isolated from the second portion.

11. The TVS device assembly of claim 8, wherein the first portion forms a first diode, wherein the second portion forms a second diode, and wherein the first diode differs from the second diode in breakdown voltage, power capacity, or breakdown voltage and power capacity.

12. The TVS device assembly of claim 11, wherein the first diode and the second diode are arranged in electrical series, anode-to-anode.

13. The TVS device assembly of claim 11, wherein the first diode comprises a breakdown voltage of 300 V or greater, and wherein the second diode comprises a breakdown voltage of 100 V or less.

14. The TVS device assembly of claim 11, wherein the first diode comprises a power capacity of 700 W or greater, and wherein the second diode comprises a power capacity of 500 W or less.

* * * * *